United States Patent
Sun et al.

(10) Patent No.: US 10,627,720 B2
(45) Date of Patent: Apr. 21, 2020

(54) OVERLAY MARK STRUCTURES

(71) Applicant: GLOBALFOUNDRIES INC., Grand Cayman (KY)

(72) Inventors: Lei Sun, Altamont, NY (US); John Zhang, Altamont, NY (US); Shao Beng Law, Watervliet, NY (US); Guoxiang Ning, Clifton Park, NY (US); Xunyuan Zhang, Albany, NY (US); Ruilong Xie, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 1 day.

(21) Appl. No.: 15/681,007

(22) Filed: Aug. 18, 2017

(65) Prior Publication Data
US 2019/0056671 A1 Feb. 21, 2019

(51) Int. Cl.
| | | |
|---|---|---|
| *G03F 7/20* | (2006.01) | |
| *H01L 21/768* | (2006.01) | |
| *H01L 23/522* | (2006.01) | |
| *H01L 23/528* | (2006.01) | |
| *H01L 23/544* | (2006.01) | |
| *C23C 14/22* | (2006.01) | |

(Continued)

(52) U.S. Cl.
CPC .......... *G03F 7/70216* (2013.01); *C23C 14/22* (2013.01); *C23C 16/455* (2013.01); *G03F 7/70633* (2013.01); *H01L 21/7682* (2013.01); *H01L 21/7684* (2013.01); *H01L 21/76816* (2013.01); *H01L 21/76849* (2013.01); *H01L 21/76877* (2013.01); *H01L 23/528* (2013.01); *H01L 23/5226* (2013.01); *H01L 23/544* (2013.01); *H01L 23/53223* (2013.01); *H01L 23/53238* (2013.01); *H01L 23/53266* (2013.01); *H01L 23/53295* (2013.01); *H01L 2223/54426* (2013.01)

(58) Field of Classification Search
CPC ............... G03F 7/70216; H01L 23/544; H01L 2223/54426; H01L 21/0276; H01L 21/7682
USPC .......................................................... 257/797
See application file for complete search history.

(56) References Cited

U.S. PATENT DOCUMENTS

| | | | | |
|---|---|---|---|---|
| 5,933,744 A | * | 8/1999 | Chen ..................... | H01L 23/544 257/E21.244 |
| 6,087,733 A | | 7/2000 | Maxim et al. | |

(Continued)

FOREIGN PATENT DOCUMENTS

WO    2016123552    8/2016

OTHER PUBLICATIONS

Yen et al. "Study on Alignment Capability and Overlay Performance in 130nm BEOL lithography process" in ICSE 2006 Proceedings. Published by IEEE in 2006.*

*Primary Examiner* — Tuan A Hoang
(74) *Attorney, Agent, or Firm* — Anthony Canale; Andrew M. Calderon; Roberts Calderon Safran & Cole, P.C.

(57) ABSTRACT

The present disclosure generally relates to semiconductor structures and, more particularly, to overlay mark structures and methods of manufacture. The method includes: forming an overlay mark within a layer of a stack of layers; increasing a density of an upper layer of the stack of layers, above the layer, the increased density protecting the overlay mark; and polishing the upper layer or one or more layers above the upper layer of the stack of layers.

13 Claims, 10 Drawing Sheets

(51) Int. Cl.
*C23C 16/455* (2006.01)
*H01L 23/532* (2006.01)

(56) References Cited

U.S. PATENT DOCUMENTS

| | | | |
|---|---|---|---|
| 6,521,537 B1 * | 2/2003 | Laursen | H01L 21/31053 |
| | | | 257/E21.244 |
| 6,678,879 B1 * | 1/2004 | Hawse | G06F 17/5068 |
| | | | 716/52 |
| 7,767,570 B2 * | 8/2010 | Chen | H01L 21/76807 |
| | | | 257/E21.495 |
| 8,243,273 B2 | 8/2012 | Levinski et al. | |
| 9,368,453 B2 | 6/2016 | Ning et al. | |
| 9,659,856 B2 * | 5/2017 | Lee | H01L 23/53295 |
| 2009/0057923 A1 * | 3/2009 | Kim | H01L 21/76801 |
| | | | 257/784 |
| 2011/0285036 A1 | 11/2011 | Yao et al. | |
| 2012/0001337 A1 * | 1/2012 | Tsai | H01L 21/6835 |
| | | | 257/770 |
| 2012/0033215 A1 | 2/2012 | Kandel et al. | |
| 2014/0375984 A1 * | 12/2014 | Choi | G01N 21/93 |
| | | | 356/73 |
| 2015/0287651 A1 * | 10/2015 | Ning | H01L 22/12 |
| | | | 257/797 |
| 2016/0313658 A1 | 10/2016 | Marciano et al. | |
| 2016/0372415 A1 * | 12/2016 | Siew | H01L 27/0886 |
| 2018/0175016 A1 * | 6/2018 | Kim | G03F 7/70683 |
| 2018/0197730 A1 * | 7/2018 | Sridhar | H01L 21/02126 |

* cited by examiner

OVERLAY MARK STRUCTURES

FIELD OF THE INVENTION

The present disclosure generally relates to semiconductor structures and, more particularly, to overlay mark structures and methods of manufacture.

BACKGROUND

Multiple layers can be utilized in semiconductor fabrication for shrinking design parameters. However, there are challenges in implementing such multiple layer structures. As an example, challenges can arise from the patterning of the layers including, more specifically, dishing from a chemical mechanical polishing (CMP) process. As is understood, dishing may result because of variations in the CMP process, such as a change in tool or change in material properties, amongst other examples.

Certain marks are implemented in each layer to assist in aligning features located in the different layers of the build structure, while other marks are implemented to verify that the alignment is proper. The dishing caused by the CMP process, though, can damage these marks, making alignment and verification of the alignment difficult. As an example, dishing can cause a mark to become thinner in advanced node technologies.

In combination with CMP dishing/erosion, further degradation of the measurement accuracy, along with impacting silicon quality, can occur. These issues become more problematic as the number of layers in the build increases, because the CMP dishing can become more accentuated as the layers accumulate. BEOL can be the most problematic area because of a relatively high hit rate due to the incoming topography accumulations. A similar challenge is also seen in the MOL. As a result, the metrology of the device is impacted.

SUMMARY

In an aspect of the disclosure, a method comprises: forming an overlay mark within a layer of a stack of layers; increasing a density of an upper layer of the stack of layers, above the layer, the increased density protecting the overlay mark; and polishing the upper layer or one or more layers above the upper layer of the stack of layers.

In an aspect of the disclosure, a method comprises: forming a mark within a first layer of a structure; forming a second layer over the first layer; forming a plurality of vias in the second layer to increase a density of the second layer, compared to the first layer; polishing the second layer or layers above the second layer; and removing material from the plurality of vias in the second layer, which are on sides of the mark.

In an aspect of the disclosure, a structure comprises: an overlay mark within a layer of a stack of layers; and a via filled with material in direct alignment with and above the overlay mark in a layer above the layer with the overlay mark.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to overlay mark structures and methods of manufacture. In embodiments, the processes and structures provided herein allow for the integrity of overlay (OVL) marks to be maintained during the build process. More specifically and advantageously, by implementing the processes described herein, the integrity of the OVL mark is preserved and protected from patterning process, e.g., dishing from a CMP process.

In embodiments, dummy features are added on each level of a build structure to prevent damage to OVL marks caused by the fabrication process. For example, the dummy features allow for a normalization of an edge saw line erosion of the build layers, preventing dishing from occurring. In embodiments, the OVL marks can be implemented in various shapes and arrangements such as a line/space or a 2D integration, for example. In further embodiments, the dummy features can occur in various shapes and arrangements such as via bars and/or lines, amongst other examples. For example, the dummy feature can be a via bar added onto the OVL mark, thereby increasing the overall metal height of the OVL mark and allowing for contrast enhancement of the OVL mark. In embodiments, the dummy features can be subsequently removed using additional patterning process, leaving the OVL mark undamaged.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1A:
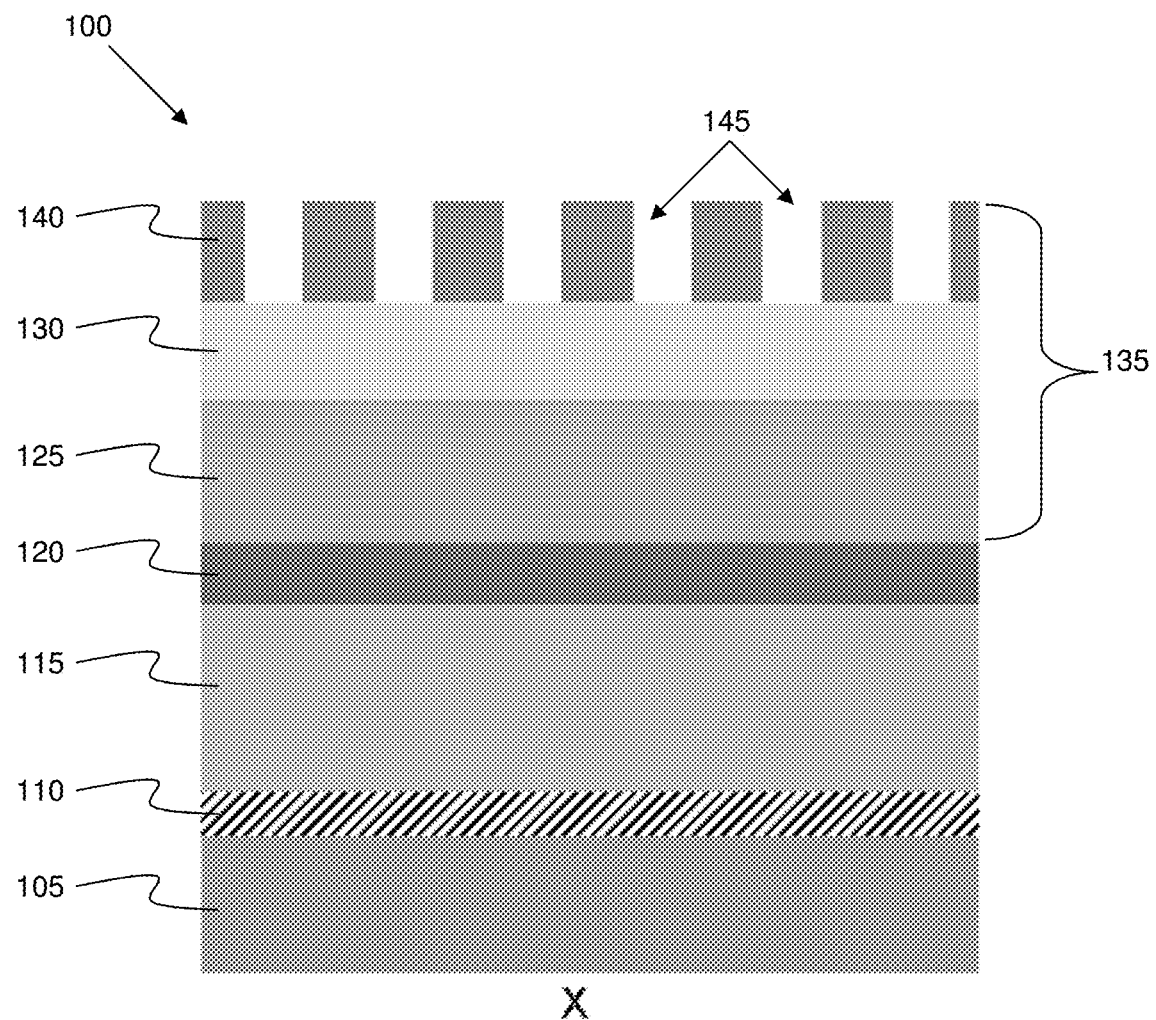
FIGS. 1A and 1B show an incoming structure and respective fabrication processes in accordance with aspects of the present disclosure.
Figure 1B:
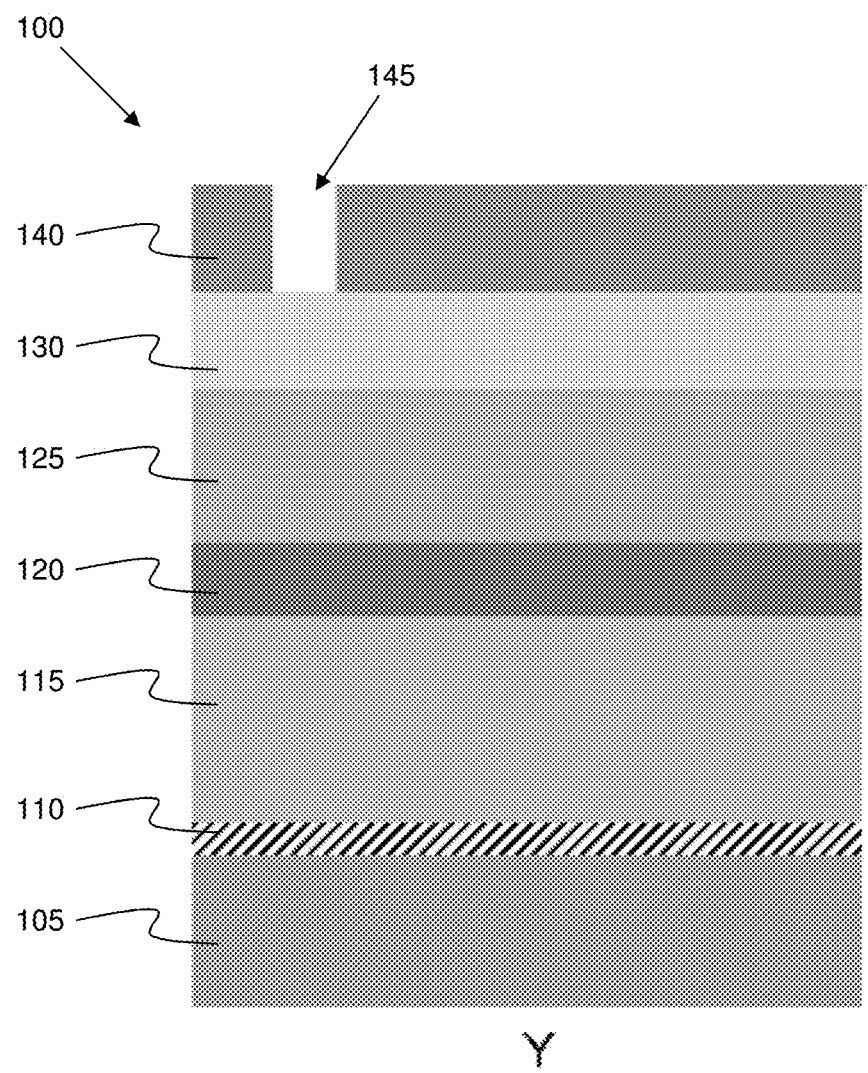

FIGS. 1A and 1B show an incoming structure comprising several material layers, and respective fabrication processes in accordance with aspects of the present disclosure. Specifically, FIG. 1A shows an initial structure 100 in an "X" direction, while FIG. 1B shows the structure 100 in a "Y" direction of a coordinate system. In embodiments, the structure 100 includes a substrate 105, which can be comprised of any appropriate semiconductor material, e.g., bulk Si, SiGe, SiGeC, SiC, GaAs, InAs, InP and other III/V or II/VI compound semiconductors. A capping layer 110 is formed over the substrate 105, which can be deposited by conventional deposition processes, e.g., physical vapor deposition (PVD) or chemical vapor deposition (CVD). The capping layer 110 can be comprised of SiN, SiCN, SiNO or SiC material, amongst other materials.

Still referring to FIGS. 1A and 1B, an interlevel dielectric (ILD) layer 115 is formed over the capping layer 110, deposited by conventional deposition processes, e.g., CVD. In embodiments, the ILD layer 115 can be comprised of a low-k dielectric material, e.g., a dense oxide material or SiN, amongst other materials. A hardmask 120 is deposited over the ILD layer 115. The hardmask 120 can be a TiN material deposited by any conventional deposition processes, e.g., PVD processes.

Following the deposition of the hardmask 120, a lithographic stack 135 is formed over the hardmask 120 for subsequent lithography and etching processes. In embodiments, the lithographic stack 135 is a trilayer lithographic stack comprised of an organic planarization layer (OPL) 125 deposited on the hardmask 120. The OPL 125 can be deposited by conventional deposition processes, e.g., spin-on, and will form part of the lithographic stack 135 used for subsequent etching of vias at least partially into the ILD layer 115. The lithographic stack 135 further comprises a coating layer 130 comprised of, e.g., an organic or inorganic anti-reflection coating (ARC), such as a silicon-containing anti-reflective coating (SiARC). As one with skill in the art would understand, the coating layer 130 can be deposited by conventional deposition processes, e.g., PVD, CVD or spin coat deposition, for example. A photoresist 140 is formed on the coating layer 130 to define a pattern for subsequent etching. More specifically, openings 145 in the photoresist 140 are used for a subsequent etching of vias at least partially into the ILD layer 115.

Figure 2A:
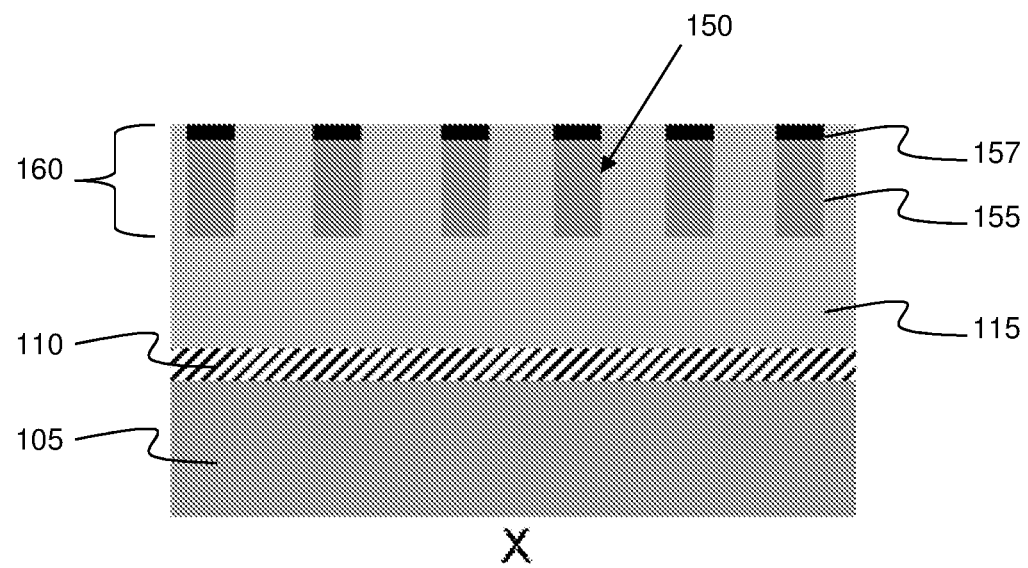
FIGS. 2A-2C show dummy features, amongst other features, and respective fabrication processes in accordance with aspects of the present disclosure.
Figure 2B:
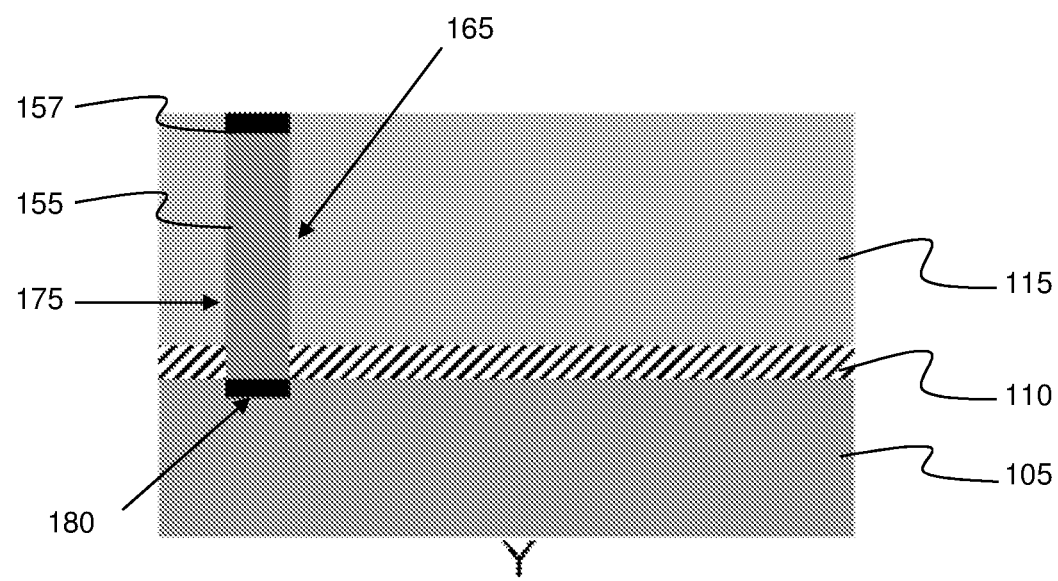
Figure 2C:
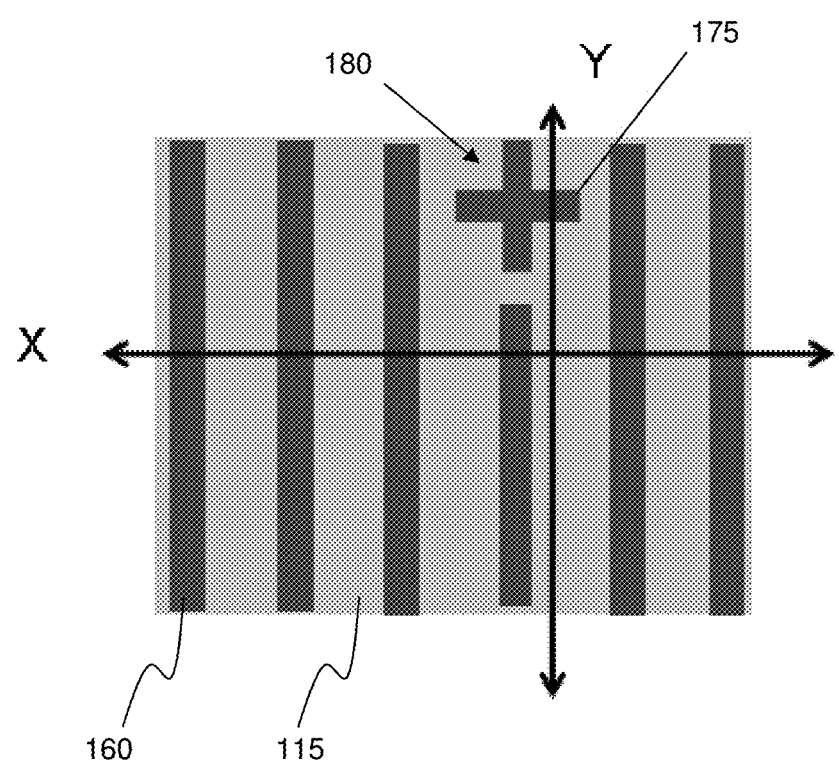

FIGS. 2A-2C show the metallization of the ILD layer 115 in the X and Y directions. Specifically, selective chemistries are used with the lithographic stack 135 to perform an etching process. More specifically, vias 150, 165 are formed within the ILD layer 115. In the etching process, a first set of vias 150 are etched to a certain distance within the ILD layer 115, whereas, a further etching is performed to form the via 165 to a different depth. Therefore, the vias 150, 165 includes vias of different depths. For example, the via 165 is substantially deeper within the ILD layer 115 in comparison to the vias 150, e.g., extending through the capping layer 110 and landing on the substrate 105.

In embodiments, the via 165 lands at a location of the substrate 105 where an overlay mark 180 is positioned. More specifically, the vias 150, 165 are on sides of the overlay mark 180, with the via 165 in direct alignment with and extending to the overlay mark 180. In further embodiments, the via 165 can be in contact with the overlay mark 180, while the remaining vias 150 are adjacent to the overlay mark 180. Since the via 165 can be in contact with the overlay mark 180, the via 165 is deeper than the remaining vias 150 of the plurality of vias 150, 165. The via 165, together with the remaining vias 150 of the plurality of vias 150, 165, provide an increased density for subsequent polishing processes.

As shown in FIG. 2B, the overlay mark 180 can be formed within or on a top surface of a first layer, i.e., the substrate 105, of the stack of layers 105, 110, 115. In embodiments, the overlay mark 180 can be printed using conventional lithography techniques, e.g., krypton fluoride laser (KrF) lithography. In embodiments, the overlay mark 180 is located and printed at each level of the build structure. As should be understood by those of skill in the art, the overlay mark 180 allows for a verification of proper alignment of the features throughout the different layers of the build, for example, gate structures, so that the device is functional. Examples of overlay marks 180 include blossom (BLO) marks and advanced imaging metrology (AIM) marks, amongst other examples. In embodiments, the overlay mark 180 can be provided in a variety of patterns such as 2D, contact, line/space, or any suitable pattern, for example. Additionally, the overlay mark 180 can take various shapes such as a cross mark, as shown in FIG. 2C, amongst other examples.

In embodiments, the vias 150, 165, which are formed within a second layer, i.e., the ILD layer 115, over the first layer, i.e., the substrate 105, can be filled with a metallization, which includes the deposition of a fill material 155, such as metal or metal alloy materials, e.g., copper (Cu), tungsten (W) or aluminum (Al), amongst other conductive materials, within the vias 150, 165, respectively. The fill material 155 is deposited using conventional deposition processes, e.g., PVD or CVD processes. A barrier metal 157 can be selectively deposited, e.g., grown, directly on the fill material 155 within the respective vias 150, 165, and can be comprised of Tantalum (Ta), Tantalum nitride (TaN), Ruthenium (Ru) or Cobalt (Co), for example. Any residual material of the fill material 155 and the barrier metal 157 on a surface of the ILD layer 115 can be removed by CMP processes.

In embodiments, the fill material 155 and the barrier metal 157 within the vias 150, 165, form the dummy features 160, 175. The dummy features 160, 175 prevent damage caused by patterning processes, e.g., CMP processes, to the overlay mark 180, during fabrication processes. For example, one of skill in the art would understand that during a gate structure formation using conventional CMOS processes, a polishing process, e.g., CMP, is implemented to form different features, e.g., back plates and well contacts. More specifically, an upper (second) layer or one or more layers above the upper layer of a stack of layers above the overlay mark 180 is polished by the polishing process.

By using the dummy features 160, 175, the CMP dishing/erosion effects can be eliminated or substantially eliminated by providing a uniform density throughout the ILD layer 115. This allows for a normalization of the edge saw line erosion for the different slurries used during the CMP process. More specifically, the dummy features 160, 175 increase a density of an upper (second) layer of the stack of layers, above the (first) layer in which the overlay mark 180 is located within or situated on a top surface of. Therefore, the second layer, i.e., the ILD layer 115, will have an increased density in comparison to the first layer, i.e., the substrate 105. The dummy features 160, 175 increase and provide a uniform density in the upper layer, i.e., the ILD layer 115, by filling the plurality of vias 150, 165 with the fill material 155 and the barrier metal 157. This increased and uniform density provided by the dummy features 160, 175, protects the overlay mark 180 from the CMP dishing/erosion effects.

As shown in FIGS. 2A and 2C, the dummy features 160 can be formed as line structures surrounding the overlay mark 180. As shown in FIGS. 2B and 2C, the dummy feature 175 can be formed as a via bar structure on the overlay mark 180. In embodiments, the via bar structure of the dummy feature 175 provides the benefit of enhancing the contrast of the overlay mark 180 by increasing an overall height of the overlay mark 180. More specifically, the via bar of the dummy feature 175 ensures a sufficient metal thickness height by the fill material 155, enhancing the contrast of the overlay mark 180. In further embodiments, the dummy features 160, 175 can be arranged in various patterns, e.g., line/space, contact, or 2D patterns, amongst other examples.

Figure 3A:
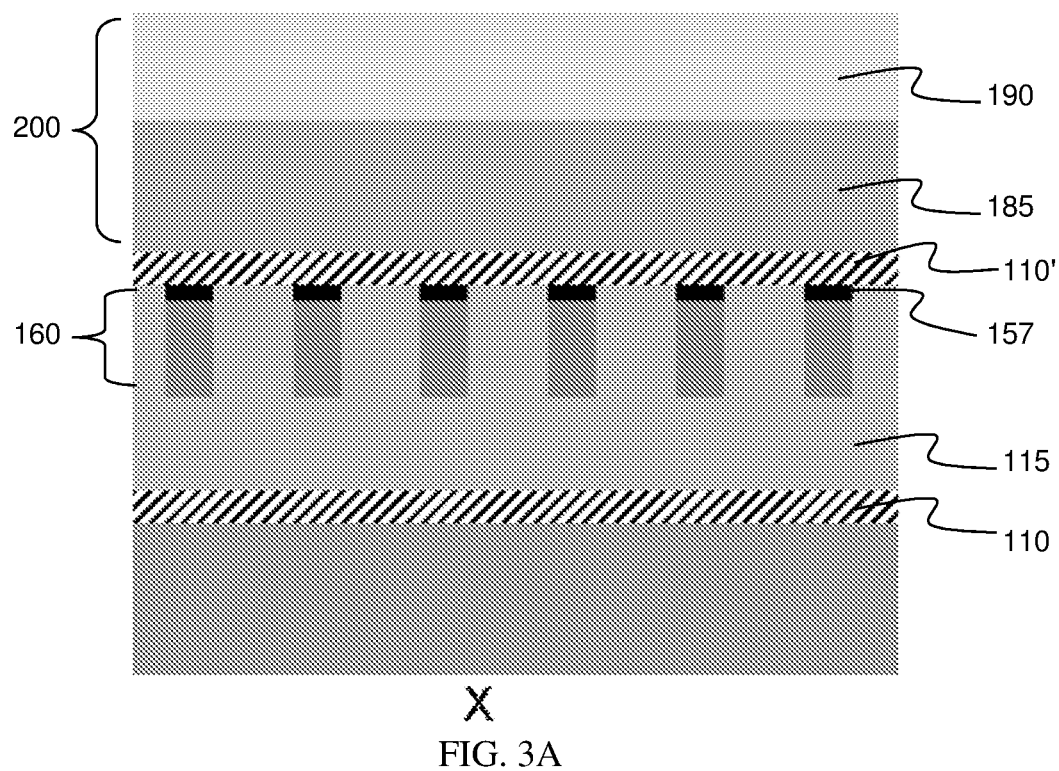
FIGS. 3A and 3B show patterned materials, amongst other features, and respective fabrication processes in accordance with aspects of the present disclosure.
Figure 3B:
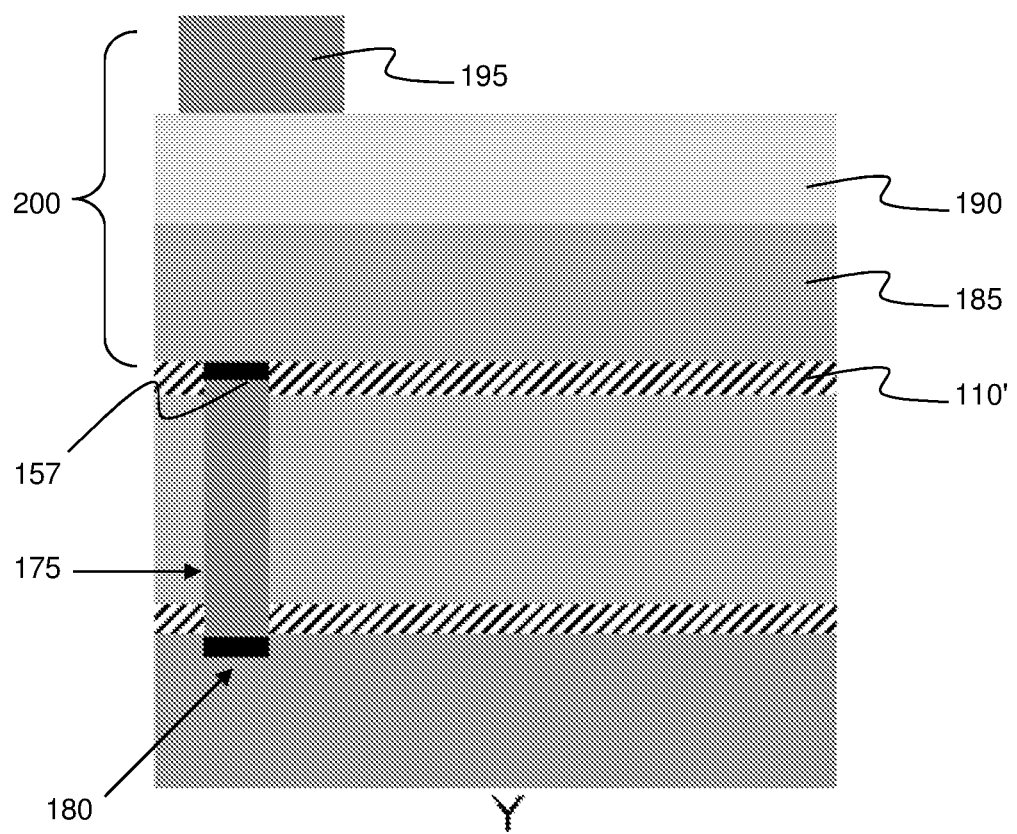

FIGS. 3A and 3B show a capping layer 110' formed over the ILD layer 115, amongst other features. In embodiments, the capping layer 110' can be SiN, SiCN, SiNO or SiC material, amongst other materials, and deposited by conventional deposition processes, e.g., PVD or CVD. A lithographic stack 200 is formed over the capping layer 110', and is comprised of an organic planarization layer (OPL) 185. The OPL 185 can be deposited by conventional deposition processes, e.g., spin-on, and will form part of the lithographic stack 200 used for subsequent etching and removal of the dummy features 160, i.e., the fill material 155 and the barrier metal 157 within the vias 150, which are adjacent to the overlay mark 180. The lithographic stack 200 further comprises a coating layer 190 comprised of, e.g., an organic or inorganic ARC or SiARC, which is deposited by, e.g., conventional deposition processes, e.g., PVD, CVD or a spin coat deposition.

A photoresist 195 is formed on the coating layer 190, and is exposed to energy (light) to define a pattern for subsequent etching processes. More specifically, as shown in FIG. 3B, the photoresist 195 is selectively formed over the dummy feature 175, while leaving the dummy features 160 exposed. In this way, the photoresist 195 is formed over the overlay mark 180, for a subsequent etching and removal of the dummy features 160 which surround the overlay mark 180. Accordingly, during the etching process, the overlay mark 180 will be protected by the photoresist 195. Subsequent to the etching process, the resist material, i.e., the photoresist 195, can be removed by conventional processes, e.g., oxygen ashing.

Figure 4A:
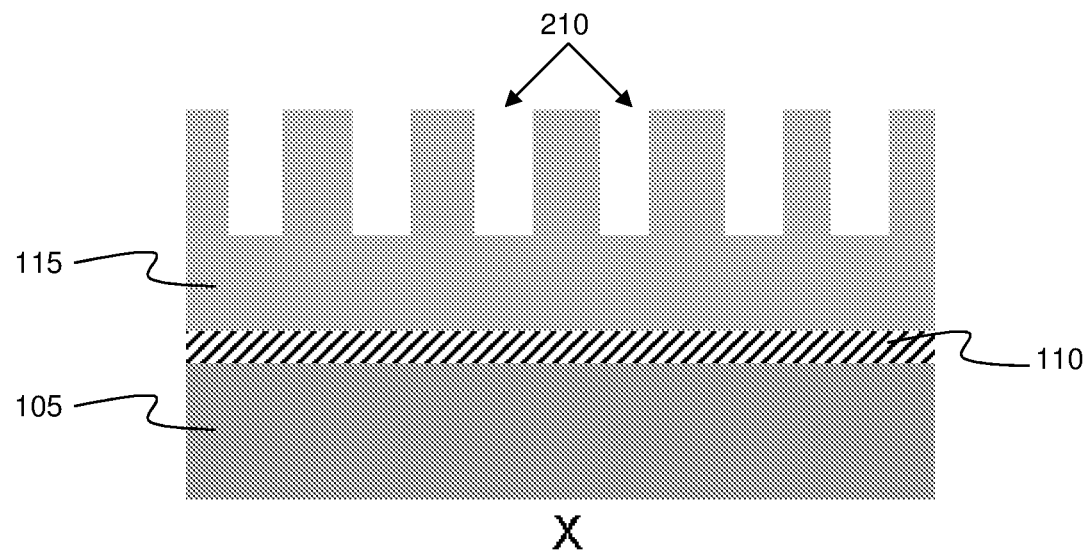
FIGS. 4A and 4B show vias, amongst other features, and respective fabrication processes in accordance with aspects of the present disclosure.
Figure 4B:
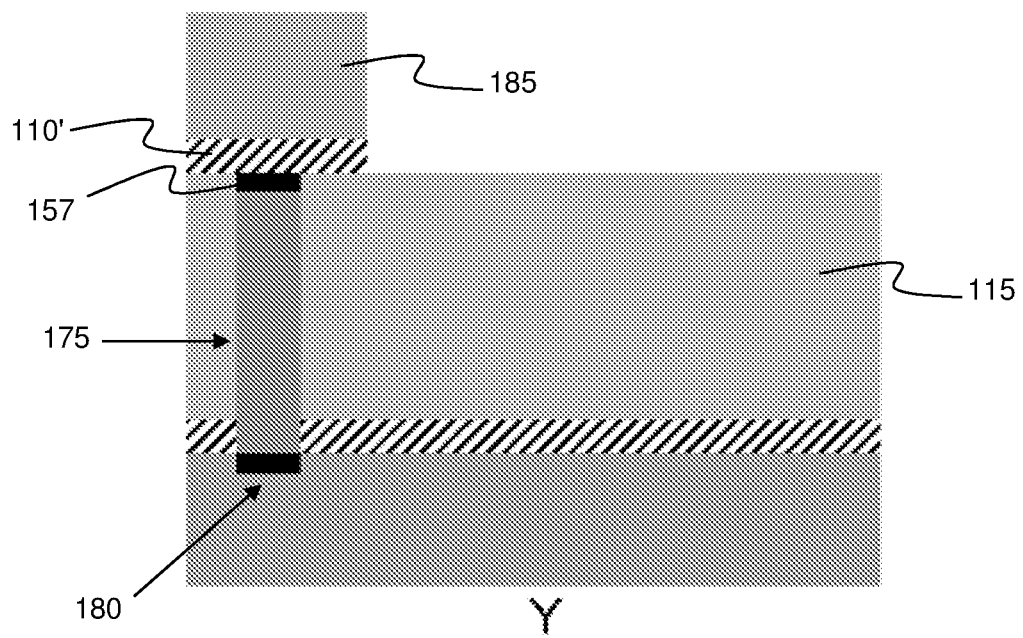

FIGS. 4A and 4B show the dummy features 160 removed while preserving the dummy feature 175. In this way, the contrast of the overlay mark 180 can be enhanced because of the increased metal height provided by the dummy feature 175. In embodiments, the dummy features 160 are removed using reactive ion etching (RIE) with a selective chemistry. That is, the fill material 155, along with the barrier metal 157, within the remaining vias 150 of the dummy features 160 is removed after the polishing process, e.g., CMP. In embodiments, the fill material 155 and the barrier metal 157 of the at least one via 165 of the dummy feature 175 over the overlay mark 180 is protected by the OPL 185 and the capping layer 110' from being removed during the removal of the fill material 155 and the barrier metal 157 within the remaining vias 150. Although FIG. 4B shows portions of the OPL 185 and the capping layer 110' covering the dummy feature 175, the OPL 185 can also be removed in subsequent processes. The dummy features 160, e.g., fill material 155 and barrier metal 157, can be removed by conventional wet etching processes, e.g., wet solutions used in fully aligned via processes can be used for the wet etch processes. The removal of the dummy features 160 creates trenches 210 in the ILD layer 115, which are relatively narrow (e.g., narrower than the dummy feature 175).

Figure 5A:
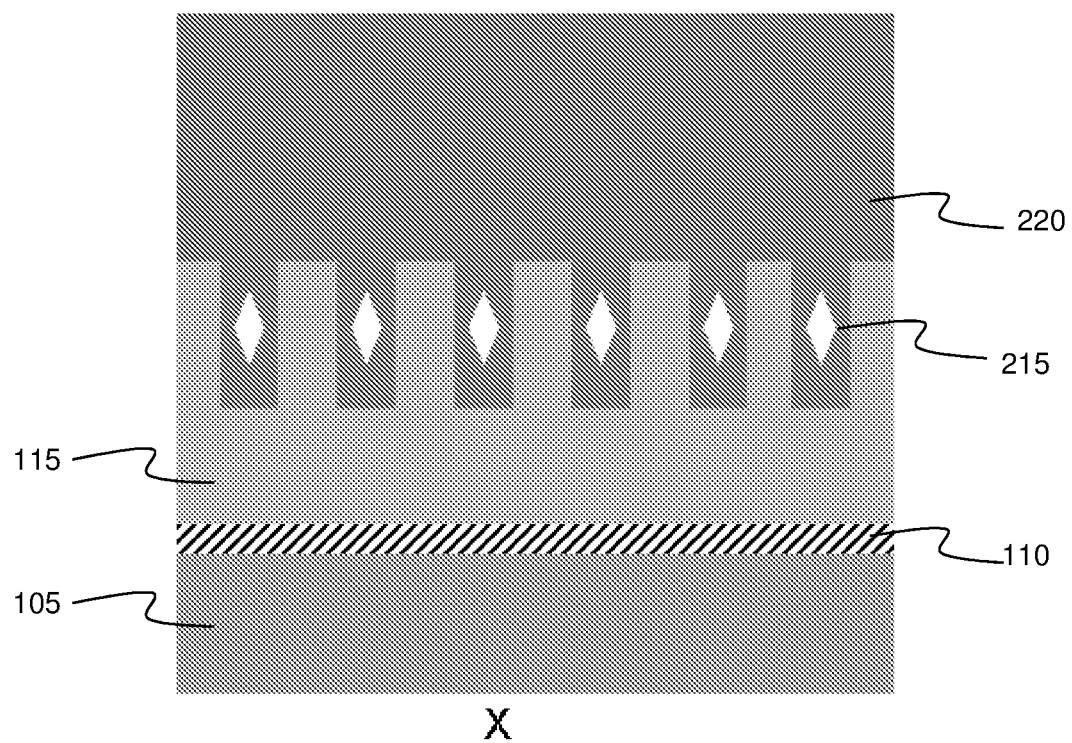
FIGS. 5A and 5B show voids, amongst other features, and respective fabrication processes in accordance with aspects of the present disclosure.
Figure 5B:
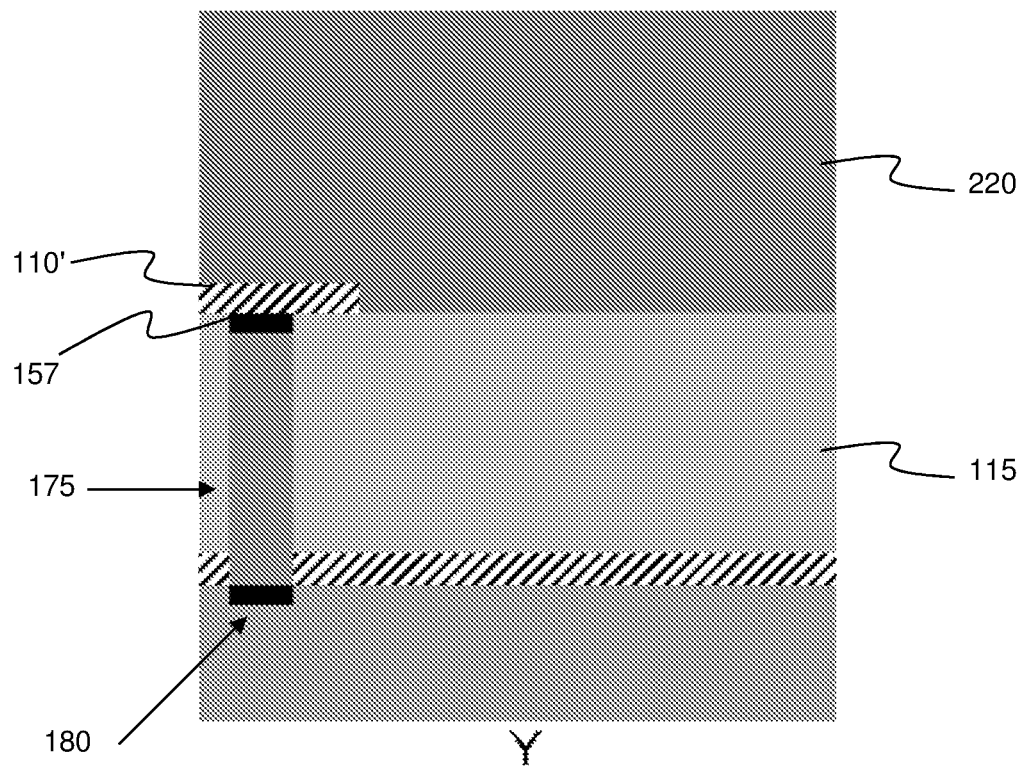

FIGS. 5A and 5B show the removal of the OPL 185 and the formation of an additional interlevel dielectric (ILD) dielectric layer 220. In embodiments, the OPL 185 can be removed by a conventional oxygen ashing process or stripant, selective to the OPL 185. Thereafter, the ILD layer 220 is formed as a fill material over the ILD layer 115, filling the trenches 210 with a dielectric material and the remaining portion of the capping layer 110'. The ILD layer 220 is deposited by conventional deposition processes, e.g., CVD, followed by a polishing process, e.g., CMP. In embodiments, the ILD layer 220 can be comprised of a low-k dielectric material, e.g., a dense oxide material or SiN, amongst other materials.

As should be understood by those of skill in the art, voids 215 can be formed in the ILD layer 220, e.g., in the trenches (vias) 210, during the deposition process. This is due to a pinch-off phenomenon. More specifically, in embodiments, the voids 215 can be airgaps formed in the dieletric material of the ILD layer 220, formed by a pinch-off process during the deposition of the ILD layer 220. The materials and the processes described for FIGS. 1A-5B are repeated starting from the ILD 220 to form dummy features in each subsequent layer of the structure.

Figure 6A:
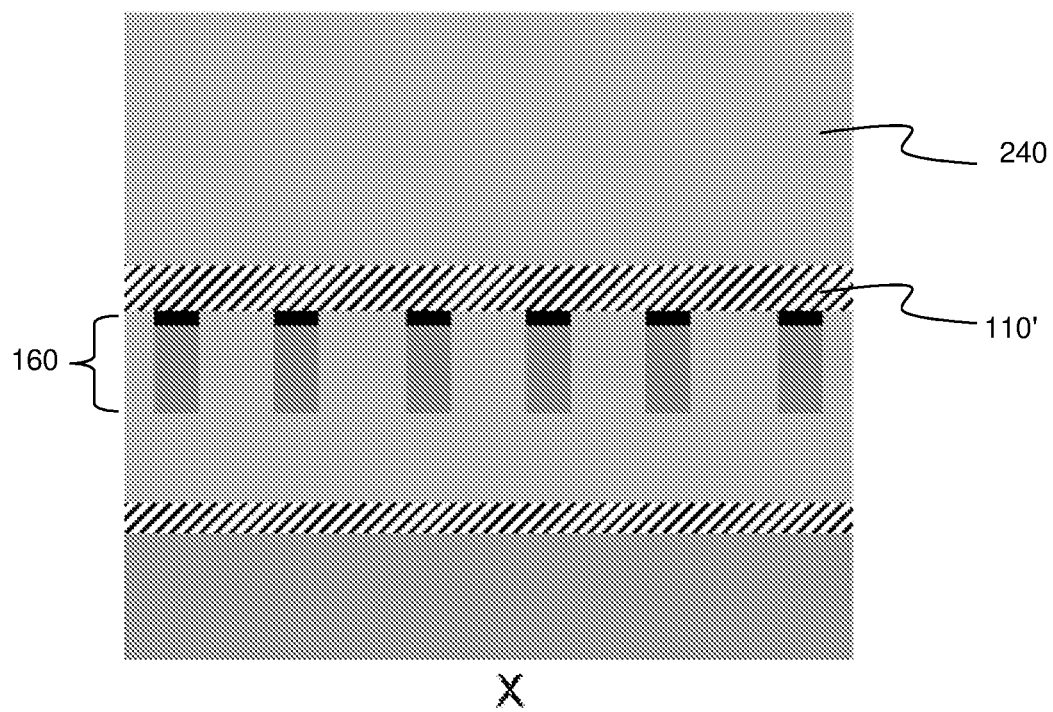
FIGS. 6A-6C show a respective structure and respective fabrication processes in accordance with alternative aspects of the present disclosure.
Figure 6B:
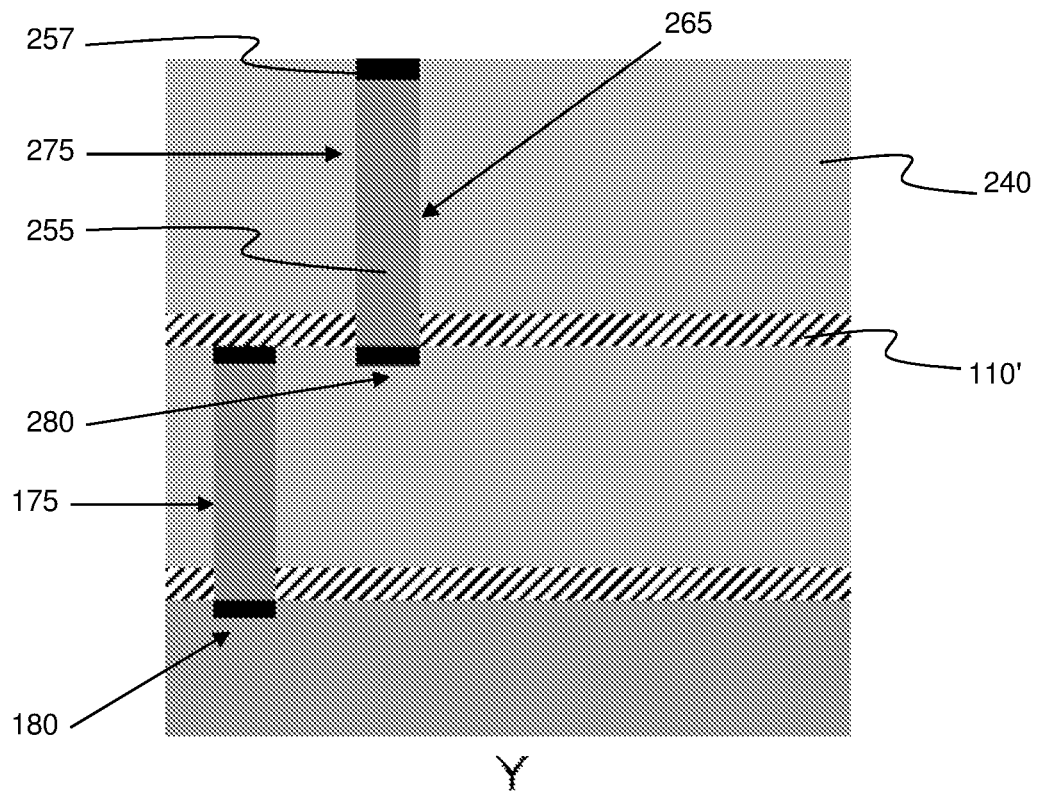
Figure 6C:
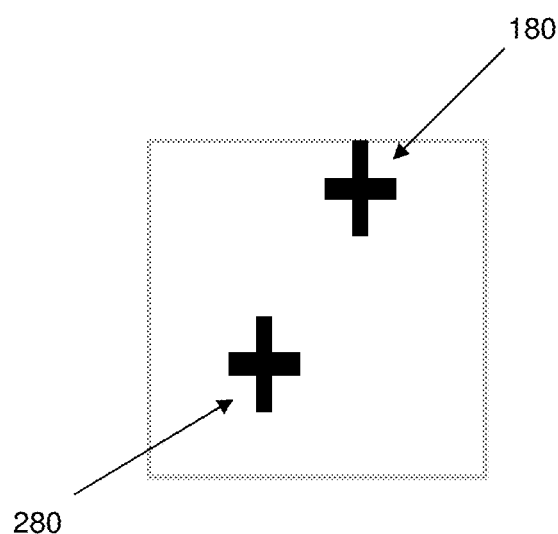

FIGS. 6A-6C illustrate an alternative embodiment in accordance with aspects of the present invention. Specifically, in addition to the overlay mark 180, a further overlay mark 280 can be formed on an upper layer of the structure, using the materials and processes already described in FIGS. 1A-5B. More specifically, an ILD layer 240 is formed over the capping layer 110', followed by an etching process to form a via 265 within the ILD layer 240. The via 265 is filled with the fill material 255, such as a metal or metal allow, and a barrier metal 257, to form the dummy feature 275. The addition of the dummy feature 275 allows for the enhancement of the contrast of the overlay mark 280 by increasing the metal height of the overlay mark 280. This allows for a greater contrast for metrology of the device. FIG. 6C shows a top plan view of the overlay marks 180, 280. In embodiments, the overlay marks 180, 280 can be offset from one another, and formed into a cross pattern, although other patterns are contemplated herein.

Figure 7A:
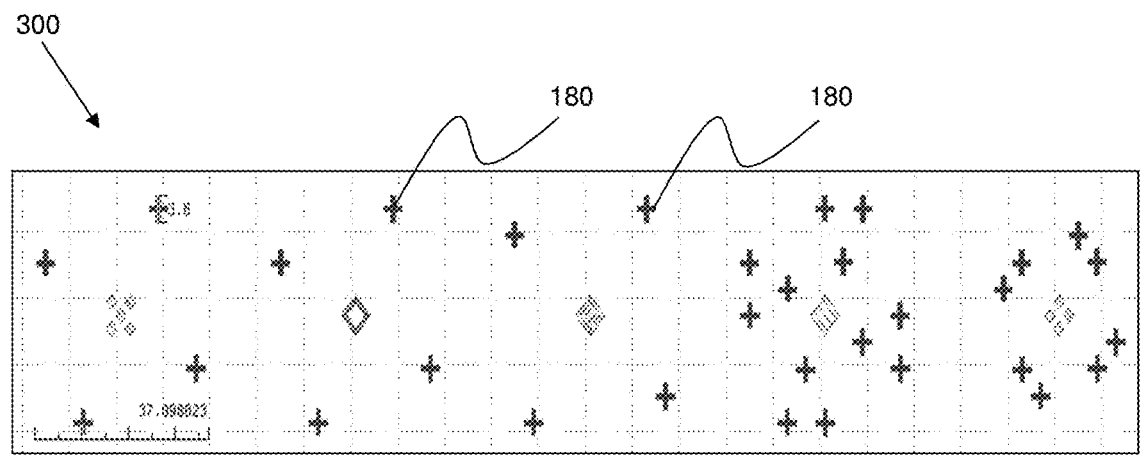
FIGS. 7A and 7B show plan views of overlay marks in structures, amongst other features, and respective fabrication processes in accordance with aspects of the present disclosure.
Figure 7B:
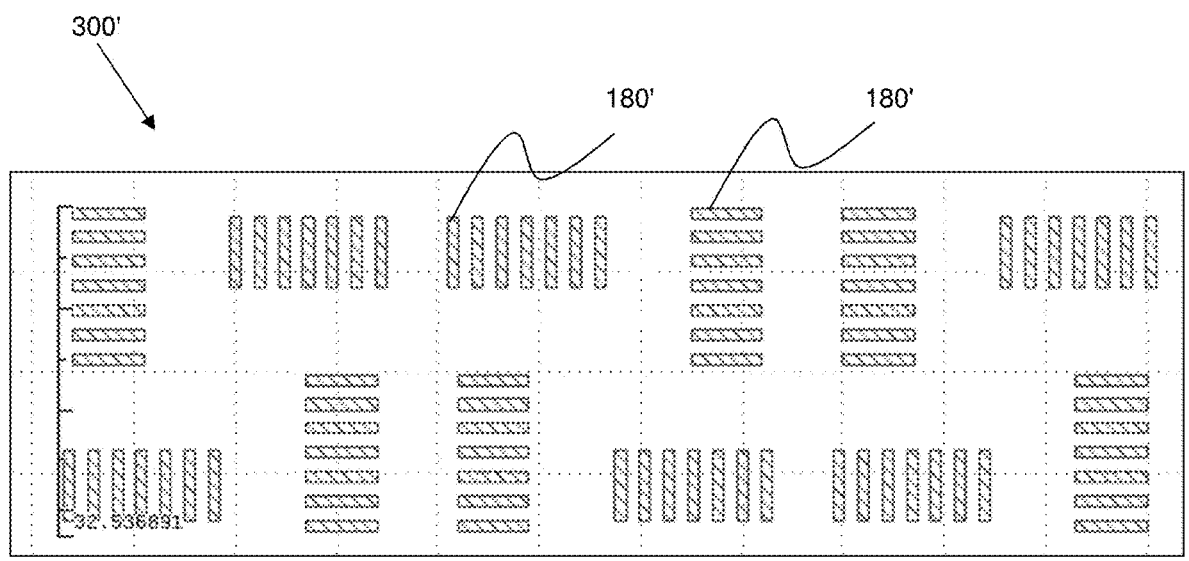

FIGS. 7A and 7B show plan views of build structure 300, 300', illustrating various overlay marks 180, 180'. Specifically, each overlay mark 180, 180' represents a different layer of the build structures 300, 300'. By implementing the processes described herein, dishing is prevented by the uniform density provided by the dummy features 160, 175, thereby allowing each overlay mark 180, 180' of each layer to be preserved and viewable. As shown in FIG. 7A, the overlay mark 180 is represented as a BLO overlay mark. In embodiments, the BLO size is 37×37 $\mu m^2$, while the cross mark size of the overlay mark 180 is 3.8×3. 8 $\mu m^2$, for example. It should be understood though, that other dimensions and shapes are contemplated herein. As shown in FIG. 7B, the overlay mark 180' is represented as an AIM overlay mark.

By implementing the processes described herein, the CMP dishing problem is solved, allowing for alignment and protection of the overlay marks, while also enhancing the contrast of the overlay marks. By solving this problem, there can be a broader choice of materials for implementing the build structure. Further, by solving the dishing problem, relatively inexpensive lithography processes can be implemented, even if these processes print large patterns which, in turn, can reduce the cost of fabrication. Also, by implementing the processes described herein, there is no need for overlay metrology between layers. In addition, the size of the overlay mark is relatively large, so that an extra margin can be added to the block design in an upper layer. For example, a block for the overlay mark in the upper layer can be increased by 0.1 μm to compensate for the overlay error.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
   forming an overlay mark within a layer of a stack of layers;
   increasing a density of an upper layer of the stack of layers by forming a plurality of dummy fill vias and a dummy via located within the upper layer of the stack of layers to protect the overlay mark and prevent dishing;
   forming the dummy via by depositing a fill material over and in direct contact with the overlay mark, the dummy via being at a different depth than a depth of the plurality of dummy fill vias;
   polishing the upper layer or one or more layers above the upper layer of the stack of layers;
   forming a plurality of trenches from the plurality of dummy fill vias;
   depositing a first capping layer over the stack of layers;
   forming an airgap in each of the trenches by depositing a dielectric material above the overlay mark, on the upper layer of the stack of layers and the first capping layer, and within the plurality of trenches formed in the upper layer of the stack of layers, the dielectric material pinching off the plurality of trenches to form the airgaps, wherein:
      the fill material in the dummy via is protected from being removed by the first capping material,
      the fill material in the dummy via has a metal material grown directly thereon,
      the dummy via is directly aligned with and extends through a second capping layer under the upper layer such that the dummy via directly contacts the overlay mark, and
      the dummy via together with the plurality of vias provides an increased density for polishing processes.

2. The method of claim 1, wherein the fill material in the dummy via comprises Cu, W or Al and the metal material comprises Ta, TaN, Ru or Co.

3. The method of claim 1, wherein each via of the plurality of dummy fill vias is filled with the fill material and the metal on the fill material, and the fill material within the plurality of dummy fill vias is removed after the polishing.

4. The method of claim 1, wherein the overlay mark is a blossom (BLO) mark or an advanced imaging metrology (AIM) mark.

5. The method of claim 1, further comprising:
   depositing an organic planarization layer directly on the first capping layer; and
   depositing a coating layer directly on the organic planarization layer; and
   depositing a photoresist directly on the coating layer and selectively over the dummy via, wherein the first capping layer is deposited directly on the layer.

6. The method of claim 5, further comprising:
   etching portions of the first capping layer which are left exposed by the photoresist; and
   depositing a dielectric layer over the etched first capping layer, wherein the barrier metal is in direct contact with the etched first capping layer.

7. The method of claim 6, wherein the plurality of trenches are formed narrower than the dummy via, the dielectric material that fills the trenches is a different material than the upper layer, and a second capping layer is formed under an interlayer dielectric material of the stack of layers with an opening such that the dummy via extends to the overlay mark.

8. The method of claim 7, wherein the dummy via and the plurality of dummy fill vias provide a uniform density to prevent the dishing thereby allowing the overlay mark to be preserved and viewable.

9. A method comprising:
   forming a mark within a first layer of a structure;
   forming a second layer over the first layer;
   forming a plurality of vias in the second layer to increase a density of the second layer compared to the first layer and to have a portion of the second layer extending across a bottom surface of all vias in the plurality of vias;
   forming a dummy via over the mark and at a different depth than a depth of the plurality of vias;
   polishing the second layer or layers above the second layer;
   protecting the mark within the first layer by depositing a capping layer and an organic planarization layer;
   forming trenches from the plurality of vias by removing fill material from the plurality of vias;
   forming air gaps in the trenches by pinching off the trenches with a dielectric material that is deposited within the trenches and on a surface of the second layer; and
   depositing a first capping layer over the first layer and the capping layer over the second layer, wherein:
      the dummy via is directly aligned with and extends from the first capping layer to the capping layer to directly contact the mark,
      the dummy via includes the fill material which is protected from being removed during the removal of the fill material from the plurality of vias, the dummy via is in contact with the mark, and together with the plurality of vias, provides an increased density for subsequent polishing processes, and the dummy via is deeper than any of the plurality of vias.

10. The method of claim 9, wherein fill material of the plurality of vias comprises Cu, W or Al.

11. The method of claim 10, wherein protecting the mark comprises protecting the fill material of the dummy via which is aligned with the mark, while removing the fill material from the plurality of vias which are adjacent to the mark.

12. The method of claim 10, wherein the fill material is removed after a polishing process, thereby forming the trenches.

13. The method of claim 12, wherein the mark is an overlay mark.

* * * * *